United States Patent [19]

Sato

[11] Patent Number: 4,489,285

[45] Date of Patent: Dec. 18, 1984

[54] SIGNAL PROCESSING CIRCUIT EMPLOYING AN IMPROVED COMPOSITE CURRENT MIRROR CIRCUIT/DEVICE

[75] Inventor: Tetsuo Sato, Takasaki, Japan

[73] Assignee: Hitachi, Ltd., Tokyo, Japan

[21] Appl. No.: 482,792

[22] Filed: Apr. 7, 1983

[30] Foreign Application Priority Data

Apr. 16, 1982 [JP] Japan .................................. 57-62438

[51] Int. Cl.³ .............................................. H03F 3/04
[52] U.S. Cl. ..................................................... 330/288
[58] Field of Search ................. 330/257, 288; 323/315, 323/316

[56] References Cited

FOREIGN PATENT DOCUMENTS 0008952 1/1979 Japan .................................. 330/257

Primary Examiner—James B. Mullins
Assistant Examiner—G. Wan

Attorney, Agent, or Firm—Antonelli, Terry & Wands

[57] ABSTRACT

An electric circuit is constructed of a first current mirror circuit and a second current mirror circuit. The first current mirror circuit has a first input transistor, a first coupling transistor and an output transistor, while the second current mirror circuit has a second input transistor, a second coupling transistor and the output transistor.

First and second input terminals are respectively connected to the collectors of the first and second input transistors, and a common output terminal is connected to the collector of the output transistor.

First and second additional transistors are respectively connected to the first and second input transistors, whereby an output current proportional to either greater value of two input currents supplied to the two input terminals is provided from the common output terminal.

17 Claims, 13 Drawing Figures

SIGNAL PROCESSING CIRCUIT EMPLOYING AN IMPROVED COMPOSITE CURRENT MIRROR CIRCUIT/DEVICE

FIELD OF THE INVENTION

The present invention relates to an improved composite current mirror circuit and a signal processing circuit which employs it. More particularly, the present invention is directed toward an improved composite current mirror circuit for detecting the maximum value of a plurality of input currents and a signal processing circuit employing it.

BACKGROUND OF THE INVENTION

FIGS. 1 to 4 show composite current mirror circuits which were studied by the inventor prior to the development of the present invention.

Figure 1:
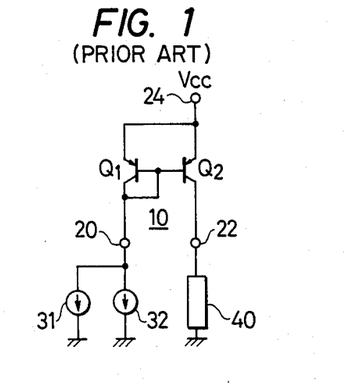
FIGS. 1, 2, 3 and 4 shows composite current mirror circuits which were studied by the inventor prior to the present invention.
Figure 2:
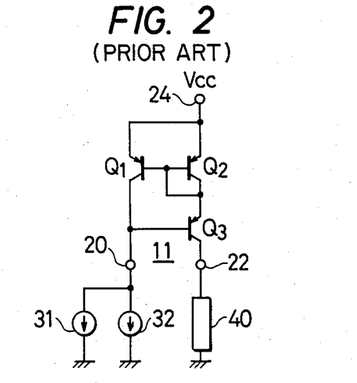

The circuit shown in FIG. 1 or FIG. 2 includes a current mirror circuit 10 or 11 which is constructed of PNP transistors $Q_1$, $Q_2$ or $Q_1$-$Q_3$ and which is well known to those in the art. A first current source 31 and a second current source 32 are connected to the input terminal 20 of the current mirror circuit 10 or 11, while a load 40 is connected to the output terminal 22 thereof. The power supply terminal 24 of the current mirror 10 or 11 is supplied with a supply voltage $V_{CC}$.

The inventor's study, however, has revealed that, with the composite current mirror circuit of FIG. 1 and FIG. 2, where the device characteristics of the PNP transistors $Q_1$ and $Q_2$ are equal to each other, an output current which is supplied from the output terminal 22 to the load 40 becomes the sum of the current flowing through the first current source 31 and the current flowing through the second current source 32, so the maximum value of the currents cannot be detected.

Figure 3:
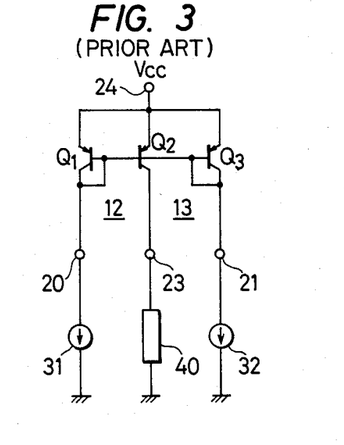

The composite current mirror circuit in FIG. 3 includes a first current mirror circuit 12 which is constructed of PNP transistors $Q_1$ and $Q_2$, and a second current mirror circuit 13 which is constructed of PNP transistors $Q_2$ and $Q_3$. A first current source 31 is connected to the input terminal 20 of the first current mirror circuit 12, while a second current source 32 is connected to the input terminal 21 of the second current mirror circuit 13. A load 40 is connected to the common output terminal 23 of the first current mirror circuit 12 and the second current mirror 13. A power supply terminal 24 is supplied with a supply voltage $V_{CC}$.

The inventor's study, however, has similarly revealed that, with the composite current mirror circuit of FIG. 3, where the device characteristics of the PNP transistors $Q_1$, $Q_2$ and $Q_3$ are equal to one another, the output current which is supplied from the output terminal 23 to the load 40 becomes half of the sum of the current flowing through the first current source 31 and the current flowing through the second current source 32, so that maximum value of the two currents cannot be detected.

Figure 4:
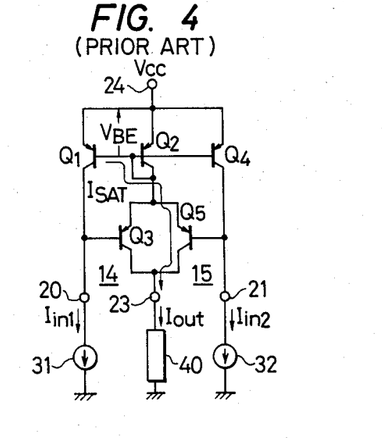

The composite current mirror circuit in FIG. 4 includes a first current mirror circuit 14 which is constructed of discrete PNP transistors $Q_1$-$Q_3$, and a second current mirror circuit 15 which is constructed of similar discrete PNP transistors $Q_2$14 $Q_5$. A first current source 31 is connected to the input terminal 20 of the first current mirror circuit 14, while a second current source 32 is connected to the input terminal 21 of the second mirror circuit 15. A load 40 is connected to the common output terminal 23 of the first current mirror circuit 14 and the second current mirror circuit 15. A power supply terminal 24 is supplied with a supply voltage $V_{CC}$.

The inventor's study has revealed that, with the composite current mirror circuit of FIG. 4, where two input currents $I_{in1}$ and $I_{in2}$ are different from one another, an accurate current comparing operation cannot be executed.

Figure 5:
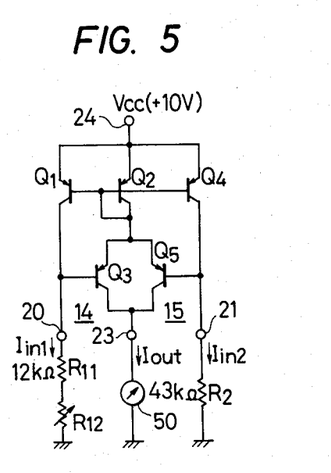
FIG. 5 shows an experimental measurement circuit for analyzing on the operation of the circuit of FIG. 4.

FIG. 5 shows a measurement circuit that was implemented for analyzing the current comparing operation of the composite current mirror circuit of FIG. 4. All the transistors $Q_1$-$Q_5$ are discrete PNP transistors. A fixed resistor $R_{11}$ of 12 kΩ and a variable resistor $R_{12}$ are connected in series to the first input terminal 20, a fixed resistor $R_2$ of 43 kΩ is connected to the second input terminal 21, and an ammeter 50 for measuring an output current $I_{OUT}$ is connected to the common output terminal 23. The first input current $I_{in1}$ is varied by changing the resistance value of the variable resistor $R_{12}$, whereas the second input current $I_{in2}$ becomes a constant current owing to the fixed resistor $R_2$.

Figure 6:
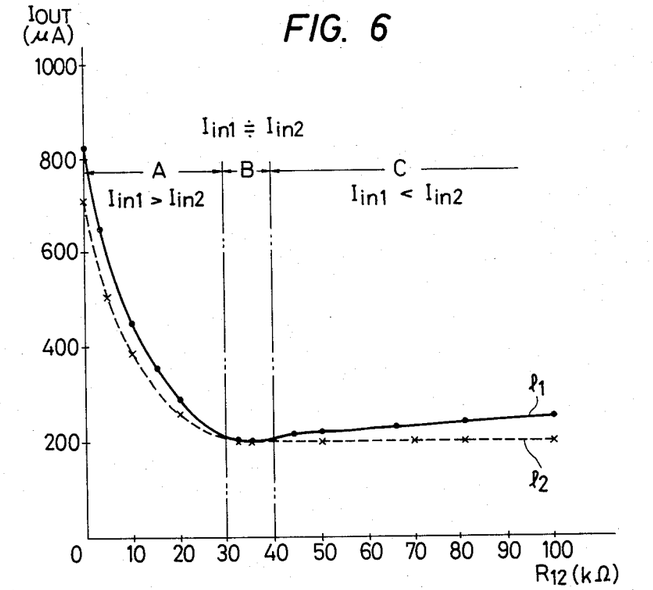
FIG. 6 is a graph showing the results obtained with the measurement circuit of FIG. 5.

FIG. 6 is a graph which shows the results of the analysis of the composite current mirror circuit of FIG. 4 obtained by the use of the experimental measurement circuit of FIG. 5.

In a region A in FIG. 6, the resistance of the variable resistor $R_{12}$ is low, so that the first input current $I_{in1}$ becomes a value greater than that of the second input current $I_{in2}$, and output current $I_{OUT}$ varies depending upon the first input current $I_{in1}$. In a region B in FIG. 6, the sum of the resistances of the fixed resistor $R_{11}$ and the variable resistor $R_{12}$ is approximately equal to the resistance of the other fixed resistor $R_2$, so that the first input current $I_{in1}$ and the second input current $I_{in2}$ have values substantially equal to each other, and further, the output current $I_{OUT}$ becomes a value substantially equal to each of the above values. In a region C in FIG. 6, the first input current $I_{in1}$ becomes a value smaller than that of the second input current $I_{in2}$ because of a high resistance of the variable resistor $R_{12}$. In the region C of FIG. 6, accordingly, it is ideally necessary for a circuit for detecting the maximum value of a plurality of currents, that the output current $I_{OUT}$ is unconditionally determined by the second input current $I_{in2}$ which is greater and contant. It has been revealed, nevertheless, that the composite currrent mirror circuit of FIG. 4 has a characteristic $l_1$ deviating from the ideal state, particularly in the region C in FIG. 6.

The inventor studied the cause of the above phenomenon, and has drawn the conclusion described below.

In the region C of FIG. 6 in which $I_{in1} < I_{in2}$ is satisfied, the base-emitter voltage $V_{BE}$ of each of the discrete PNP transistors $Q_1$, $Q_2$ and $Q_4$ in FIG. 4 is obtained as follows in accordance with the greater current $I_{in2}$:

$$V_{BE} = \frac{KT}{q} \ln \frac{I_{in2}}{I_s} \tag{1}$$

where K denotes Boltzmann's constant, T the absolute temperature, q the magnitude of electronic charge, and $I_s$ a saturation current in the reverse direction.

Accordingly, the base-emitter junction of the transistor $Q_1$ is biased by the base-emitter voltage $V_{BE}$ determined by Equation (1), so that a current equal to the second input current $I_{in2}$ tends to flow through the emitter-collector path of the transistor. Since, however, the high resistance $R_{12}$ is connected to the collector of the transistor $Q_1$, the current to flow through the emitter-collector path thereof is limited to the smaller first input current $I_{in1}$. Thus, in the region C of FIG. 6 which satisfies $I_{in1} < I_{in2}$, the discrete PNP transistor $Q_1$ in FIG. 4 is driven into its saturation region, and hence, the collector-base junction thereof is forward-biased. A transistor saturation current $I_{SAT}$ based on the saturation of the transistor $Q_1$ flows through a path illustrated in FIG. 4, and is supplied to the load 40 via the common output terminal 23.

Unless such transistor saturation current $I_{SAT}$ is supplied to the common output terminal, the output current $I_{OUT}$ will be unconditionally determined by the greater and constant second input current $I_{in2}$ under the condition of $I_{in1} < I_{in2}$. In actuality, however, the above transistor saturation current $I_{SAT}$ flows in the composite current mirror circuit of FIG. 4, so that a deviation from the ideal state occurs in the region C of FIG. 6.

Further, it has been similarly revealed that in the region A of FIG. 6 in which $I_{in1} > I_{in2}$ is fulfilled, the discrete PNP transistor $Q_4$ is driven into its saturation region, resulting in a deviation from an ideal state in the region A.

SUMMARY OF THE INVENTION

The present invention has been developed on the basis of the above analysis of current mirror circuit operation by the inventor, and has as an object the provision of a circuit for detecting the maximum value of a plurality of input currents and/or a signal processing circuit employing the same.

DESCRIPTION OF THE PREFERRED EMBODIMENTS

Several embodiments according to the present invention will now be described with reference to the drawings.

Figure 7:
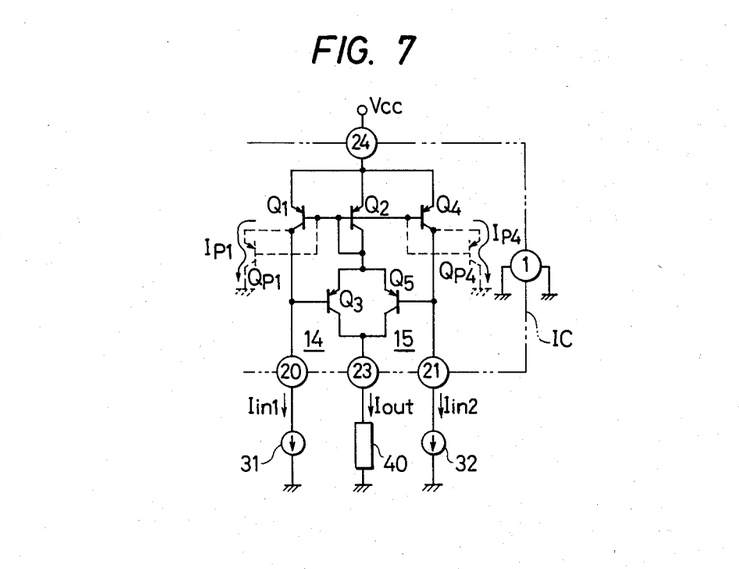
FIG. 7 shows an equivalent circuit of a composite current mirror circuit according to an embodiment of the present invention.

FIG. 7 shows an equivalent circuit of a composite current mirror circuit for detecting the maximum value of a plurality of input currents, according to an embodiment of the present invention. Circuit elements inside a two-dot chain line IC are formed within a silicon chip of a monolithic semiconductor integrated circuit. Such an electric circuit, that is, a composite current mirror circuit, includes a first current mirror circuit 14 and a second current mirror circuit 15 which are constructed of lateral PNP transistors $Q_1-Q_5$ that are formed within the silicon chip. Terminals 20, 21, 23 and 24 are the external terminals of the semiconductor integrated circuit. A first current source 31 is connected to the input terminal 20 of the first current mirror circuit 14, a second current source 32 is connected to the input terminal 21 of the second current mirror circuit 15, a load 40 is connected to the common output terminal 23 of the first current mirror circuit 14 and the second current mirror circuit 15, and the power supply terminal 24 is fed with a supply voltage $V_{CC}$. Further, according to the present invention, parasitic PNP transistors $Q_{P1}$ and $Q_{P4}$ as additional transistors are respectively connected to the PNP transistors $Q_1$ and $Q_4$.

Figure 8:
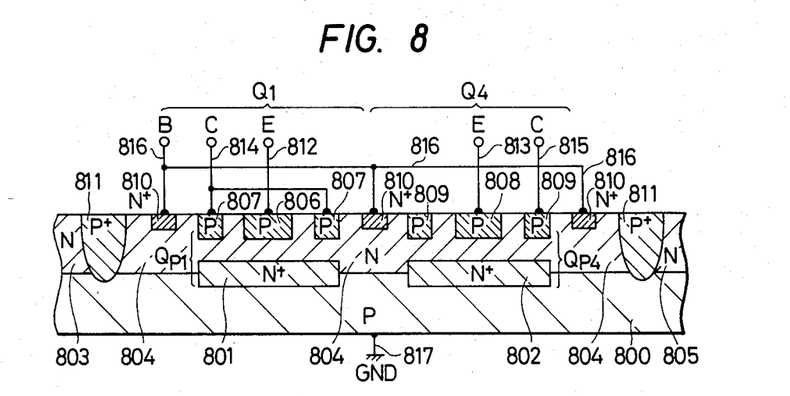
FIG. 8 is a sectional view of the essential portions of the semiconductor integrated circuit of the electric circuit according to the embodiment of FIG. 7.

FIG. 8 shows a sectional view of the essential portions of the semiconductor integrated circuit according to the presently described embodiment. $N^+$-type buried layers 801 and 802 are formed in the top surface of a P-type silicon substrate 800, and N-type epitaxially grown layers 803, 804 and 805 are further formed thereon.

In the N-type epitaxially grown layer 804, there are formed a plurality of P-type impurity diffused layers 806, 807, 808 and 809 and an $N^+$-type impurity diffused layer 810.

In the surface of the N-type epitaxially grown layer 804, the P-type diffused layer 807 surrounds the P-type diffused layer 806 in the form of a ring, the P-type diffused layer 809 surrounds the P-type diffused layer 808 in the form of a ring, and the $N^+$-type diffused layer 810 surrounds these P-type diffused layers 806, 807, 808 and 809. Further, an isolation region 811 is formed in the N-type epitaxially grown layer 804 by $P^+$-type diffusion.

Emitter electrodes 812 and 813 form ohmic contacts with the P-type diffused layers 806 and 808 respectively, collector electrodes 814 and 815 form ohmic contacts with the P-type diffused layers 807 and 809 respectively, and a base electrode 816 forms an ohmic contact with the $N^+$-type diffused layer 810. An electrode 817 which forms an ohmic contact with the rear surface of the P-type substrate 800 is connected to ground potential.

Thus, the lateral PNP transistor $Q_1$ is formed of the P-type diffused layers 806, 807, N-type epitaxial layer 804 and $N^+$-type diffused layer 810, while the lateral PNP transistor $Q_4$ is formed of the P-type diffused layers 808, 809, N-type epitaxial layer 804 and $N^+$-type diffused layer 810.

It is to be noted that the first parasitic PNP transistor $Q_{P1}$ as the additional transistor is formed of the P-type diffused layer 807, N-type epitaxial layer 804 and P-type substrate 800, while the second parasitic PNP transistor $Q_{P4}$ as the additional transistor is formed of the P-type diffused layer 809, N-type epitaxial layer 804 and P-type substrate 800. Equivalently, the emitters of the parasitic PNP transistors $Q_{P1}$ and $Q_{P4}$ are respectively connected to the collectors of the lateral PNP transistors $Q_1$ and $Q_4$, the bases of the parasitic PNP transistors $Q_{P1}$ and $Q_{P4}$ are respectively connected to the bases of the lateral PNP transistors $Q_1$ and $Q_4$, and the collectors of the parasitic PNP transistors $Q_1$ and $Q_4$ are connected to ground potential.

According to the embodiment of the present invention shown in FIGS. 7 and 8, the maximum value of a plurality of input currents can be detected with high precision for the reasons described below.

Where the first input current $I_{in1}$ of the first current source 31 is greater than the second input current $I_{in2}$ of the second current source 32, there is a danger that the PNP transistor $Q_4$ receiving the smaller current $I_{in2}$ will be driven into its saturation state. In this case, as illustrated in FIG. 7, at the same time that the collector-base junction of the PNP transistor $Q_4$ is forward-biased, the emitter-base junction of the parasitic PNP transistor $Q_{P4}$ is also forward-biased. Accordingly, the collector current $I_{P4}$ of the PNP transistor $Q_4$ flows to ground potential via the emitter-collector path of the parasitic PNP transistor $Q_{P4}$. Thus, in the case of $I_{in1} > I_{in2}$, it becomes possible to reduce the inflow of the transistor saturation current $I_{SAT}$ of the PNP transistor $Q_4$ to the load 40.

On the contrary, where $I_{in1} < I_{in2}$, the PNP transistor $Q_1$ receiving the smaller current $I_{in1}$ is in danger of being driven into its saturation state. In this case, as illustrated in FIG. 7, at the same time that the collector-base junction of the PNP transistor $Q_1$ is forward-biased, the emitter-base junction of the parasitic PNP transistor $Q_{P1}$ is also forward-biased. Accordingly, the collector current $I_{P1}$ of the PNP transistor $Q_1$ flows to ground via the emitter-collector path of the parasitic PNP transistor $Q_{P1}$. Thus, in the case of $I_{in1} < I_{in2}$, it becomes possible to reduce the inflow of the transistor saturation current $I_{SAT}$ of the PNP transistor $Q_1$ to the load 40.

The experimental result of the current comparing operation of the embodiment of the present invention shown in FIGS. 7 and 8, the result having been obtained with the measurement circuit of FIG. 5, is indicated by a characteristic curve $l_2$ in FIG. 6. It has been verified that the characteristic curve $l_2$ of FIG. 6 agrees, with very high precision, with an ideal current comparing operation in the case where the base-emitter voltage $V_{BE}$ of each of the PNP transistors $Q_1$–$Q_5$ in the composite current mirror circuit of FIG. 7 is 0.7 volt.

Figure 9:
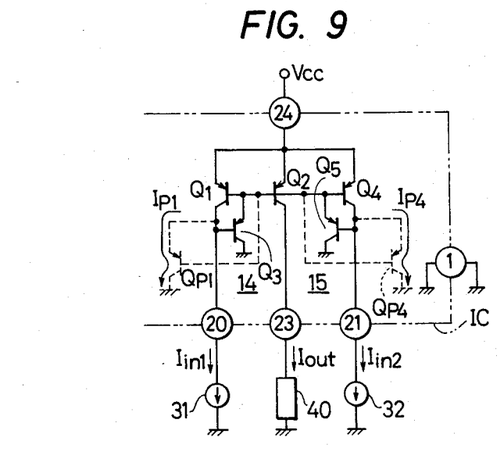
FIG. 9 shows an equivalent circuit of a composite current mirror circuit according to a second embodiment of the present invention.

FIG. 9 shows an equivalent circuit of an electric circuit for detecting the maximum value of a plurality of input currents, according to a second embodiment of the present invention. Circuit elements inside two-dot chain line IC are formed within the silicon chip of a monolithic semiconductor integrated circuit. Transistors $Q_1$–$Q_5$ are lateral PNP transistors, and the collectors and bases of the respective PNP transistors $Q_1$, $Q_4$ are connected through the base-emitter junctions of the other PNP transistors $Q_3$, $Q_5$. Further, parasitic PNP transistors $Q_{P1}$, $Q_{P4}$ are equivalently connected to the respective PNP transistors $Q_1$, $Q_4$ as additional transistors. In particular, the PNP transistors $Q_1$, $Q_4$ and the parasitic PNP transistors $Q_{P1}$, $Q_{P4}$ are constructed as shown in the sectional view of FIG. 8. With respect to the others, the same parts as in FIG. 7 are assigned the same reference numerals and will not be described here. Also within the present embodiment, in the case of $I_{in1} > I_{in2}$ or $I_{in1} < I_{in2}$, the parasitic PNP transistor $Q_{P4}$ or $Q_{P1}$ turns "on", respectively, to afford a reduction in the inflow of the transistor saturation current $I_{SAT}$ of the PNP transistor $Q_4$ or $Q_1$ to the load 40.

Figure 10:
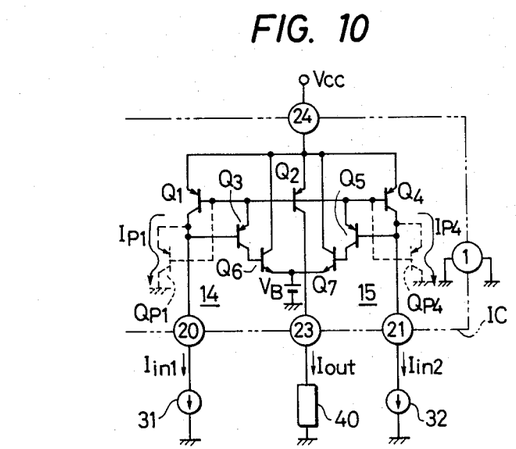
FIG. 10 shows an equivalent circuit of a composite current mirror circuit according to a third embodiment of the present invention.

FIG. 10 shows an equivalent circuit of an electric circuit for detecting the maximum value of a plurality of input currents, according to a third embodiment of the present invention. Circuit elements inside two-dot chain line IC are formed within the silicon chip of a monolithic semiconductor integrated circuit. Transistors $Q_1$–$Q_5$ are lateral PNP transistors, while transistors $Q_6$, $Q_7$ are vertical NPN transistors. A difference from the embodiment of FIG. 9 is the fact that NPN transistors $Q_6$, $Q_7$ are respectively connected to PNP transistors $Q_3$, $Q_5$ and that the emitters of both the transistors $Q_6$, $Q_7$ are supplied with a bias voltage $V_B$. Parasitic PNP transistors $Q_{P1}$, $Q_{P4}$ are equivalently connected to the respective PNP transistors $Q_1$, $Q_4$ as additional transistors. In particular, the PNP transistors $Q_1$, $Q_4$ and the parasitic PNP transistors $Q_{P1}$, $Q_{P4}$ are constructed as shown in the sectional view of FIG 8. Also, within the present embodiment, it is possible, in the case of $I_{in1} > I_{in2}$ or $I_{in1} < I_{in2}$, to reduce the inflow of the transistor saturation current $I_{SAT}$ to the load 40.

Figure 11:
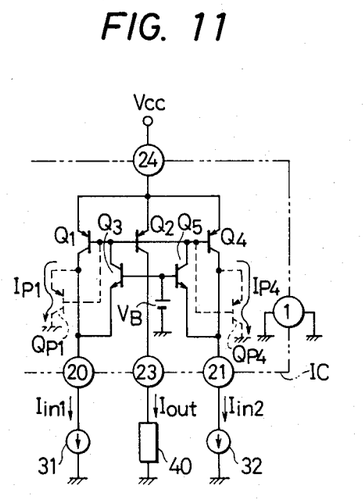
FIG. 11 shows an equivalent circuit of a composite current mirror circuit according to a fourth embodiment of the present invention.

FIG. 11 shows an equivalent circuit of an electric circuit for detecting the maximum value of a plurality of input currents, according to a fourth embodiment of the present invention. Circuit elements inside a two-dot chain line IC are formed within the silicon chip of a monolithic semiconductor integrated circuit. Transistors $Q_1$, $Q_2$, $Q_4$ are lateral PNP transistors, while transistors $Q_3$ and $Q_5$ are vertical NPN transistors. The bases and collectors of the respective PNP transistors $Q_1$, $Q_4$ are connected through the collector-emitter paths of the NPN transistors $Q_3$, $Q_5$, and the bases of both transistors $Q_3$, $Q_5$ are supplied with a bias voltage $V_B$. Parasitic PNP transistors $Q_{P1}$, $Q_{P4}$ are equivalently connected to the respective PNP transistors $Q_1$, $Q_4$ as additional transistors. In particular, the PNP transistor $Q_1$, $Q_4$ and the parasitic PNP transistors $Q_{P1}$, $Q_{P4}$ are constructed as shown in the sectional view of FIG. 8. Also within the present embodiment, it is possible, in the case of $I_{in1} > I_{in2}$ or $I_{in1} < I_{in2}$, to reduce the inflow of the transistor saturation current $I_{SAT}$ to the load 40.

Figure 12A:
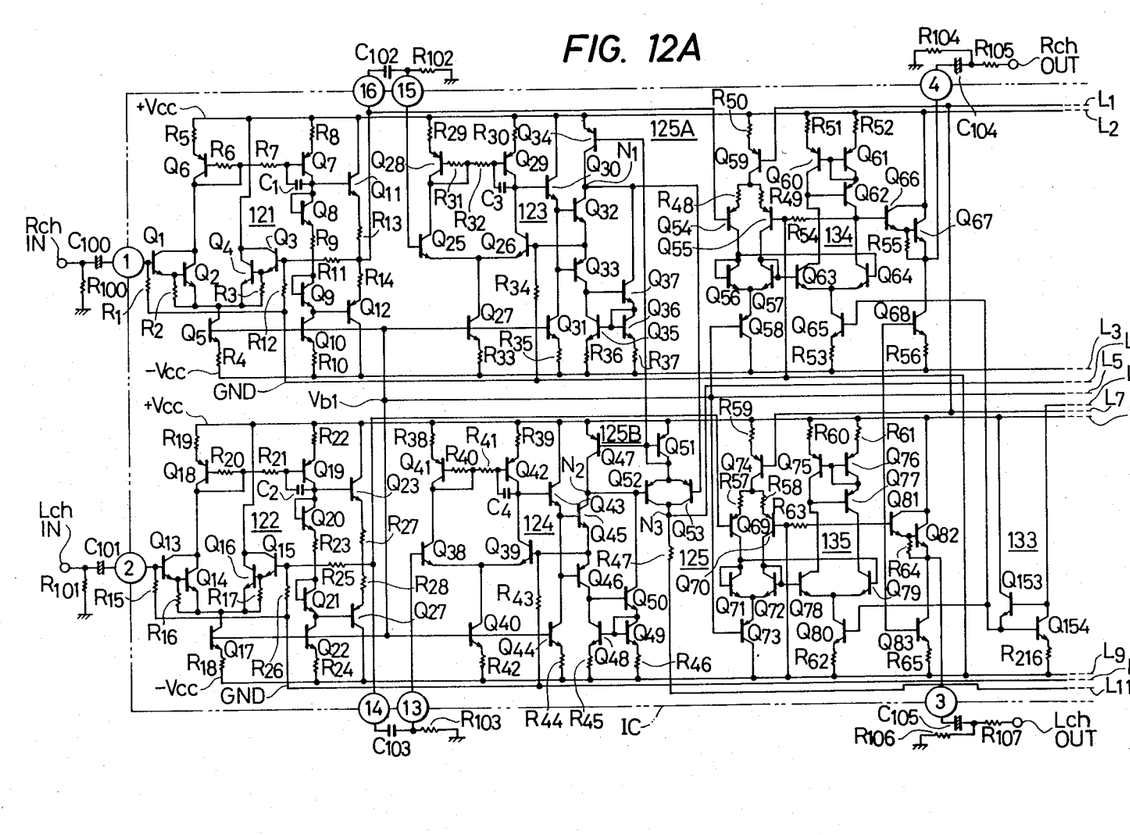
FIGS. 12A and 12B are circuit diagrams of a signal processing circuit according to another embodiment of the present invention.
Figure 12B:
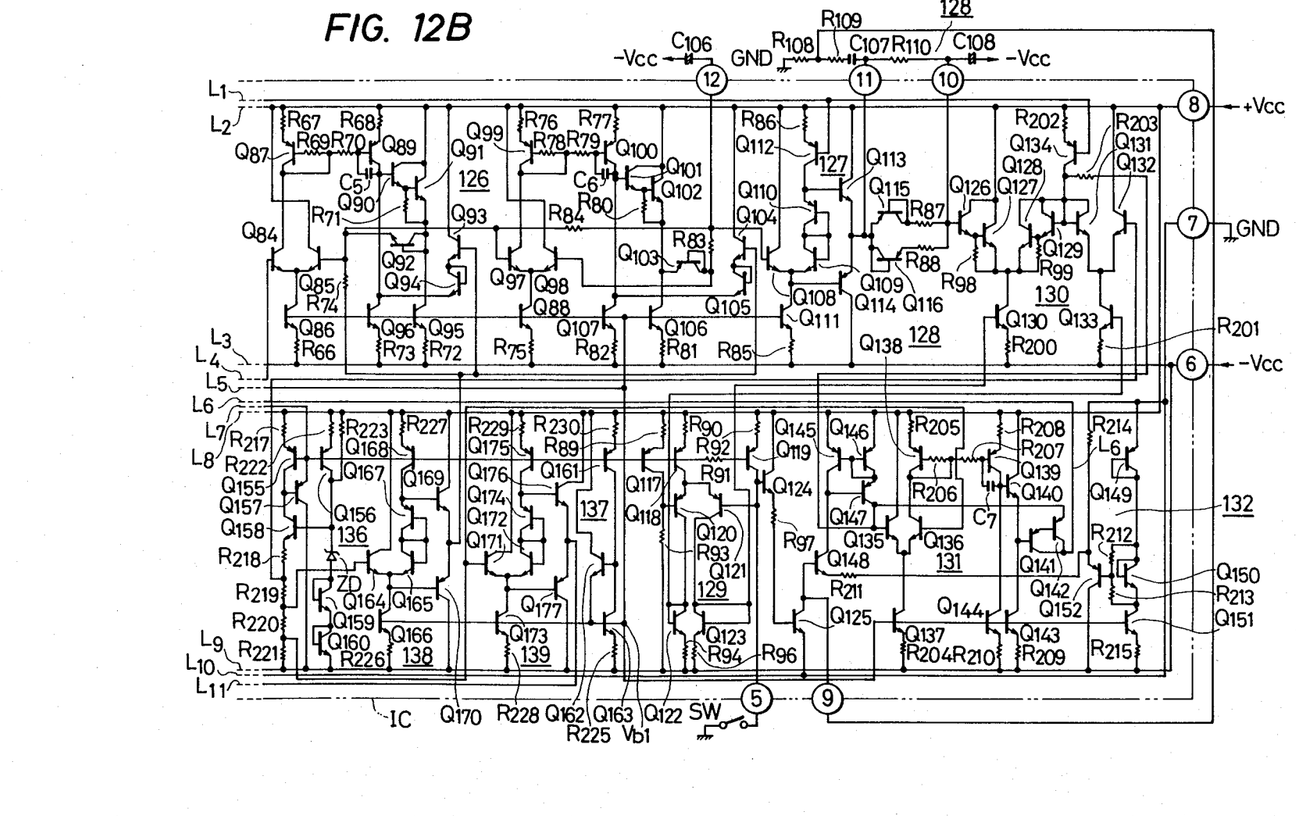

FIGS. 12A and 12B show circuit diagrams of a signal processing circuit according to another embodiment of the present invention. Such a signal processing circuit is a CX (Compatible Expansion) type expander, and is effective for the noise reduction of a record or the audio system of an optical video disk.

The principle of operation of such a signal processing circuit as a noise reduction system is reported in IEEE Transactions on Consumer Electronics, November 1981, Volume CE-27, Number 4, pp. 626–630, and reference may be had thereto for a full understanding of the same.

Circuit elements inside a two-dot chain line IC are formed within the silicon chip of a monolithic semiconductor integrated circuit, and the other circuit elements are constructed of discrete components.

A right channel audio input signal and a left channel audio input signal, which have been compressed by a CX type compressor, are respectively supplied to a terminal No. 1 and a terminal No. 2 through coupling capacitors $C_{100}$ and $C_{101}$ and are respectively amplified by a first input amplifier 121 and a second input amplifier 122.

The first input amplifier 121 is constructed of transistors $Q_1$–$Q_{12}$, resistors $R_1$–$R_{14}$ and a phase compensation capacitor $C_1$, while the second input amplifier 122 is constructed of transistors $Q_{13}$–$Q_{24}$, resistors $R_{15}$–$R_{28}$ and a phase compensation capacitor $C_2$.

The output signal of the first input amplifier 121 provided from terminal No. 16 is supplied through a coupling capacitor $C_{102}$ to terminal No. 15 which is the input terminal of a first full-wave rectifier 123, while the output signal of the second input amplifier 122 is provided from terminal No. 14 is supplied through a coupling capacitor $C_{103}$ to terminal No. 13 which is the input terminal of a second full-wave rectifier 124.

The first full-wave rectifier 123 is constructed of transistors $Q_{25}-Q_{33}$ and $Q_{35}-W_{37}$, resistors $R_{29}-R_{53}$ and a phase compensation capacitor $C_3$, to thereby provide a first full-wave rectification current at a node $N_1$. The second full-wave rectifier 124 is constructed of transistors $Q_{38}-Q_{46}$ and $Q_{48}-Q_{50}$, resistors $R_{38}-R_{46}$ and a phase compensation capacitor $C_4$, to thereby provide a second full-wave rectification current at a node $N_2$. Such a full-wave rectifier is described in Japanese Laid-Open Patent Application No. 52-123850.

A maximum current detector 125 includes a first current mirror circuit 125A which is constructed of PNP trnasistors $Q_{34}$, $Q_{51}$ and $Q_{53}$, and a second current mirror circuit 125B which is constructed of PNP transistors $Q_{47}$, $Q_{51}$ and $Q_{52}$. A load resistor $R_{47}$ is connected to the common output terminal $N_3$ of the first current miror circuit 125A and the second current mirror circuit 125B. The PNP transistor $Q_{34}$ and $Q_{47}$ are respectively formed, as shown by the lateral PNP transistors $Q_1$ and $Q_4$ in the sectional view of FIG. 8. As in each of the foregoing embodiments, therefore, parasitic PNP transistors are equivalently connected to the respective PNP transistors $Q_{34}$ and $Q_{47}$ and as additional transistors. Accordingly, where the first full-wave rectification current of the node $N_1$ is greater than the second full-wave rectification current of the node $N_2$ or, in the converse case, either of the two parasitic PNP transistors turns "on", the inflow of the transistor saturation current $I_{SAT}$ of the PNP transistor $Q_{34}$ or $Q_{47}$ to the load $R_{47}$ can be reduced.

A maximum current detection output signal having developed across the load $R_{47}$ is supplied through a wiring lead $L_4$ to the input of a peak detector 126 (the base of a transistor $Q_{84}$). Such a peak detector 126 is constructed of transistors $Q_{84}-Q_{107}$, resistors $R_{66}-R_{84}$, phase compensation capacitors $C_5$ and $C_6$ and a peak holding capacitor $C_{106}$. A peak hold voltage is generated at terminal No. 12.

This peak hold voltage produced at terminal No. 12 is transmitted to terminal No. 11 through a low output impedance buffer circuit 127 which is constructed of transistors $Q_{108}-Q_{114}$ and resistors $R_{85}$ and $R_{86}$.

Connected to terminals Nos. 10 and 11, is a time constant circuit 128 which is constructed of transistors $Q_{115}$ and $Q_{116}$, resistors $R_{87}$, $R_{88}$ and $R_{108}-R_{110}$ and capacitors $C_{107}$ and $C_{108}$. A rise time constant of about 30 msec is established by the resistor $R_{87}$ and the capacitor $C_{108}$, while a decay time constant of about 200 msec is established by the resistor $R_{88}$ and the capacitor $C_{108}$.

A first control circuit 129, which is controlled by a control switch SW connected to terminal No. 5, is constructed of transistors $Q_{117}-Q_{125}$ and resistors $R_{89}-R_{97}$. When the control switch SW has been turned "on", the transistor $Q_{120}$ of the first control circuit 129 is turned "off", transistor $Q_{121}$ is turned "on" and transistors $Q_{124}$ and $Q_{125}$ are turned "off". At this time, a transistor $Q_{130}$ is turned "on" and a transistor $Q_{133}$ is turned "off" in a switching type low output impedance buffer circuit 130 which is constructed of transistors $Q_{126}-Q_{134}$ and resistors $R_{98}$, $R_{99}$ and $R_{200}-R_{203}$. Accordingly, the voltage at terminal No. 10 is transmitted to the input terminal of a second control circuit 131 (the base of a transistor $Q_{135}$) through the transistors $Q_{126}-Q_{129}$ and resistor $R_{203}$ of the buffer circuit 130.

On the other hand, the second control circuit 131 is constructed of transistors $Q_{135}-Q_{148}$, resistors $R_{204}-R_{211}$ and a phase compensation capacitor $C_7$. A first bias circuit 132, which is constructed of transistors $Q_{149}-Q_{152}$ and resistors $R_{212}-R_{215}$, supplies a fixed voltage to a resistor $R_{211}$.

The capacitor $C_{107}$ and resistors $R_{108}$ and $R_{109}$, which are connected to terminal No. 11, constitute a high-pass filter. The output signal of the high-pass filter at the common juncture of the resistors $R_{108}$ and $R_{109}$ is transmitted to the base of the transistor $Q_{148}$ through terminal No. 9. Since transistors $Q_{145}-Q_{147}$ connected to the collector of the transistor $Q_{148}$ constitute a current mirror circuit, the signal transmitted from terminal No. 10 and the signal transmitted from terminal No. 11 are added to each other at the input terminal of the second control circuit 131 (the base fo the transistor $Q_{135}$). The additional signal is transmitted to the collector of the PNP transistor $Q_{141}$ as well as $Q_{142}$, and is further transmitted to a third control circuit 133 through a wiring lead $L_6$.

The third control circuit 133 is constructed of transistors $Q_{153}$ and $Q_{154}$ and a resistor $R_{216}$, and provides a control output signal from the emitter of the transistor $Q_{153}$.

A first variable gain amplifier 134 is constructed of transistors $Q_{54}-Q_{68}$ and resistors $R_{48}-R_{56}$, and its gain varies depending upon the collector current value of the transistor $Q_{65}$. Likewise, a second variable gain amplifier 135 is constructed of transistors $Q_{69}-Q_{83}$ and resistors $R_{57}-R_{65}$, and its gain varies depending upon the collector current value of the transistor $Q_{80}$.

Thus, the first variable gain amplifier 134 variably amplifies the output signal of the first input amplifier 121 at terminal No. 16 and transmits the amplified signal to terminal No. 4, while the second variable gain amplifier 135 variably amplifies the output signal of the second input amplifier 122 at terminal No. 122 and transmits the amplified signal to terminal No. 3. It is therefore possible to obtain a right channel audio output signal and a left channel audio output signal which have been expanded by the signal processing circuit functioning as the CX type expander.

A second bias circuit 136 is constructed of transistors $Q_{155}-Q_{160}$, a Zener diode ZD and resistors $R_{217}-R_{223}$, and generates a plurality of bias voltages.

A third bias circuit 137 is constructed of transistors $Q_{161}-Q_{163}$ and resistors $R_{224}$ and $R_{225}$, and generates a bias voltage $V_{bl}$ at the base of the transistor $Q_{163}$.

A buffer circuit 138, which is constructed of transistors $Q_{164}-W_{170}$ and resistors $R_{226}$ and $R_{227}$, transmits the bias voltage at the common juncture of the resistors $R_{219}$ and $R_{220}$ to the emitters of the transistors $Q_{169}$ and $Q_{170}$ with a low output impedance. A buffer circuit 139, which is constructed of transistors $Q_{171}-Q_{177}$ and resistors $R_{228}$ and $R_{229}$, transmits the bias voltage at the common juncture of the resistors $R_{220}$ and $R_{221}$ to the emitters of the transistors $Q_{176}$ and $Q_{177}$ with a low output impedance.

Accordingly, where the signal processing circuit operates as the CX type expander, the gain of the first variable gain amplifier 134 and that of the second variable gain amplifier 135 are simultaneously determined by either greater one of the first full-wave rectification current of the node $N_1$ and the second full-wave rectification current of the node $N_2$. It is therefor possible to provide a CX type expander of high precision.

When the control switch SW connected to terminal No. 5 has been turned "off", the transistor $Q_{120}$ of the first control circuit 129 is turned "on", the transistor $Q_{121}$ is turned "off" and the transistors $Q_{124}$ and $Q_{125}$ are turned "on". Then, such signal processing circuit stops the operation as the CX type expander.

The respective embodiments of the present invention described above can adopt various modified aspects of performance within the common knowledge of those skilled in the art.

By way of example, it is clear that the electric circuit according to any of the embodiments of FIGS. 7, 9, 10 and 11 can be utilized as the maximum current detector 125 in FIG. 12A.

What is claimed is:

1. An electric circuit comprising:
   (a) a first current mirror circuit having a first input bipolar transistor, a first coupling bipolar transistor and an output bipolar transistor, wherein the emitter of said first input transistor and the emitter of said output transistor are connected together, the base of said first input transistor and the base of said output transistor are connected together, the collector and the base of said first input transistor are connected through said first coupling transistor, a first input terminal connected to the collector of said first input transistor, and an output terminal connected to the collector of said output transistor; and
   (b) a second current mirror circuit having a second input bipolar transistor, a second coupling bipolar transistor, and said output transistor, wherein the emitter of said second input transistor and the emitter of said output transistor are connected together, the base of said second input transistor and the base of said output transistor are connected together, the collector and the base of said second input transistor are connected through said second coupling transistor, a second input terminal connected to the collector of said second input transistor, and an output terminal common to said output terminal of said first current mirror circuit;
   said first current mirror circuit further having a first additional bipolar transistor whose emitter, base and collector are respectively connected to the collector and base of said first input transistor and a reference potential, while said second current mirror circuit further has a second additional bipolar transistor whose emitter, base and a collector are respectively connected to the collector and base of said second input transistor and said reference potential;
   said first input terminal being supplied with a first input current and said second input terminal being supplied with a second input current, whereby an output current proportional to either greater value of the two input currents is provided from said common output terminal.

2. An electric circuit according to claim 1, wherein the base of said first input transistor and the base of said second input transistor are formed of an N-type semiconductor layer on a P-type semiconductor substrate, and the collector of said first input transistor and the collector of said second input transistor are respectively formed of a first P-type semiconductor layer and a second P-type semiconductor layer which are formed within said N-type semiconductor layer; with the result that the emitter of said first additional transistor is effectively formed of said first P-type semiconductor layer, the emitter of said second additional transistor is effectively formed of said second P-type semiconductor layer, the base of said first additional transistor and the base of said second additional transistor are effectively formed of said N-type semiconductor layer, and the collector of said first additional transistor and the collector of said second additional transistor are effectively formed of said P-type semiconductor substrate.

3. A signal processing circuit comprising:
   (a) a first input amplifier for amplifying a first input signal;
   (b) a second input amplifier for amplifying second input signal;
   (c) a first rectifier for producing a first rectifier current from an A.C. output signal of said first input amplifier;
   (d) a second rectifier for producing a second rectified current from an A.C. output signal of said second input amplifier;
   (e) a maximum current detector for producing an output signal which is proportional to either greater value of the first and second rectified currents;
   (f) a peak detector having an input terminal connected to an output terminal of said maximum current detector;
   (g) a time constant circuit having an input terminal connected to an output terminal of said peak detector;
   (h) a first variable gain amplifier circuit having an input terminal supplied with the output signal of said first input amplifier, and the gain of which is controlled by an output signal of said time constant circuit, whereby a first expanded output signal is provided from its output terminal; and
   (i) a second variable gain amplifier circuit having an input terminal supplied with the output signal of said second input amplifier, and the gain of which is controlled by the output signal of said time constant circuit, whereby a second expanded output signal is provided from its output terminal; and
   wherein said maximum current detector comprises:
   (1) a first current mirror circuit having a first bipolar transistor, a first coupling bipolar transistor and an output bipolar transistor, wherein the emitter of said first input transistor and the emitter of said output transistor are connected together, the base of said first input transistor and the base of said output transistor are connected together, the collector and the base of said first input transistor are connected through said first coupling transistor, a first input terminal connected to the collector of said first input transistor, and an output terminal connected to the collector of said output transistor; and
   (2) a second current mirror circuit having a second input bipolar transistor, a second coupling bipolar transistor and said output bipolar transistor, wherein the emitter of said second input transistor and the emitter of said output transistor are connected together, the base of said second input transistor and the base of said output transistor are connected together, the collector and the base of said second input transistor are connected through said second coupling transistor, a second input terminal connected to the collector of said second input transistor, and wherein said output terminal is connected to the collector of said output transistor; and wherein said first current mirror circuit further includes a first additional bipolar transistor whose emitter, base and collector are respectively connected to the collector and base of said first input transistor and a reference potential, while said second current mirror circuit further includes a second additional bipolar transistor whose emitter, base and collector are respectively connected to the collector and base of said second input transistor and said reference potential, and said first input terminal is supplied with said first rectified current, while said second input terminal is supplied with said second rectified current.

4. A signal processing circuit according to claim 3, wherein the base of said first input transistor and the base of said second input transistor are formed of an N-type semiconductor layer on a P-type semiconductor substrate, and the collector of said first input transistor and the collector of said second input transistor are respectively formed of a first P-type semiconductor layer and a second P-type semiconductor layer which are formed within said N-type semiconductor layer; the emitter of said first additional transistor being effectively formed of said first P-type semiconductor layer, the emitter of said second additional transistor being effectively formed of said second P-type semiconductor layer, the base of said first additional transistor and the base of said second additional transistor being effectively formed of said N-type semiconductor layer and the collector of said first additional transistor and the collector of said second additional transistor being effectively formed of said second P-type semiconductor layer, the base of said first additional transistor and the base of said second additional transistor being effectively formed of said N-type semiconductor layer, the collector of said first additional transistor and the collector of said second additional transistor being effectively formed of said P-type semiconductor substrate.

5. An electric circuit comprising:
(a) a first current mirror circuit including a first input bipolar transistor, a first coupling bipolar transistor and an output bipolar transistor, the emitters of said first input and output transistors being connected together, the bases of said first input and output transistors being connected together, the base of said first input transistor being coupled through said first coupling transistor to the collector of said first input transistor, a first input terminal connected to the collector of said first input transistor to which a first input current is supplied and an output terminal coupled to the collector of said output transistor;
(b) a second current mirror circuit including a second input bipolar transistor, a second coupling bipolar transistor and said output transistor, the emitters of said second input and output transistors being connected together, the bases of said second input and output transistors being connected together, the base of said second input transistor being coupled through said second coupling transistor to the collector of said second input transistor, a second input terminal connected to the collector of said second input transistor to which a second input current is supplied and an output terminal in common with the output terminal of said first current mirror circuit coupled to the collector of said output transistor; and
(c) means, coupled to said first and second input transistors, for selectively preventing said first and second input transistors from being driven into their saturation states in response to an imbalance in said first and second input currents, so that an output current is coupled from said common output termnal representative of the larger of said first and second input currents.

6. An electric circuit according to claim 5, wherein said means comprises means for selectively diverting the collector currents of said first and second input transistors so as to controllably reduce the inflow of saturation currents to said first and second input transistors.

7. An electric circuit according to claim 6, wherein said means comprises, within said first current mirror circuit a first additional bipolar transistors, the emitter, base and collector of which are respectively connected to the collector and base of said first input transistor and a reference potential terminal and, within said second current mirror circuit, a second additional bipolar transistor the emitter, base and collector of which are respectively connected to the collector and base of said second input transistor and said reference potential terminal.

8. An electric circuit according to claim 7, wherein said common output terminal is directly connected to the collector of said output transistor.

9. An electric circuit according to claim 7, wherein said first and second input and coupling transistors and said output transistor are formed as an integated circuit.

10. An electric circuit according to claim 9, wherein said first and second additional transistors are parasitic transistors within said integrated circuit.

11. An electric circuit according to claim 10, wherein the base of said first input transistor and the base of said second input transistor are formed of an N-type semiconductor layer on a P-type semiconductor substrate, and the collector of said first input transistor and the collector of said second input transistor are respectively formed of a first P-type semiconductor layer and a second P-type semiconductor layer which are formed within said N-type semiconductor layer; with the result that the emitter of said first additional transistor is effectively formed of said first P-type semiconductor layer, the emitter of said second additional transistor is effectively formed of said second P-type semiconductor layer, the base of said first additional transistor and the base of said second additional transistor are effectively formed of said N-type semiconductor layer, and the collector of said first additional transistor and the collector of said second additional transistor are effectively formed of said P-type semiconductor substrate.

12. An electric circuit according to claim 7, wherein said common output terminal is coupled through said first and second coupling transistors to the collector of said output transistor.

13. An electric circuit according to claim 8, wherein the collectors of said first and second coupling transistors are coupled to said reference potential terminal.

14. An electric circuit according to claim 8, further including first and second bias coupling transistors respectively coupled between said first and second coupling transistors and a bias voltage terminal.

15. An electric circuit according to claim 8, wherein the bases of said first and second coupling transistors are coupled to a source of bias potential.

16. An electric circuit according to claim 5, wherein said electric circuit constitutes a maximum current detector circuit within an audio signal processing circuit.

17. An electric circuit according to claim 5, wherein said electric circuit constitutes a maximum current detector circuit within a compatible expansion type expander circuit.

* * * * *